United States Patent
Beretta

(10) Patent No.: US 6,731,557 B2
(45) Date of Patent: May 4, 2004

(54) METHOD OF REFRESHING AN ELECTRICALLY ERASABLE AND PROGRAMMABLE NON-VOLATILE MEMORY

(75) Inventor: Franco Enrico Beretta, Monza (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 10/176,387

(22) Filed: Jun. 20, 2002

(65) Prior Publication Data

US 2003/0012064 A1 Jan. 16, 2003

(30) Foreign Application Priority Data

Jun. 21, 2001 (EP) .............................. 01830418

(51) Int. Cl.⁷ ................................................ G11C 7/00
(52) U.S. Cl. .................................. 365/222; 365/185.22
(58) Field of Search ............................. 365/222, 185.22

(56) References Cited

U.S. PATENT DOCUMENTS 5,250,831 A   10/1993  Ishii ............................ 257/354
5,656,840 A    8/1997  Yang .......................... 257/316
6,160,739 A   12/2000  Wong ..................... 365/185.29
6,194,759 B1 * 2/2001  Sano et al. ................. 257/314

OTHER PUBLICATIONS

European Search report dated Nov. 22, 2001 for European Appln. No. 01830418.8.

* cited by examiner

*Primary Examiner*—M. Tran
(74) *Attorney, Agent, or Firm*—Lisa K. Jorgenson; Jon A. Gibbons; Fleit, Kain, Gibbons, Gutman, Bongini & Bianco P.L.

(57) ABSTRACT

A method (1110*a*;1110*b*) of refreshing an electrically erasable and programmable non-volatile memory (100) having a plurality of memory cells (Mhk) is proposed. The method includes the steps of: verifying (1106–1114; 1152–1162) whether a memory cell has drifted from a correct condition (i.e., a predetermined voltage and/or voltage range), and individually restoring (1116–1130) the correct condition of the memory cell if the result of the verification is positive.

20 Claims, 12 Drawing Sheets

METHOD OF REFRESHING AN ELECTRICALLY ERASABLE AND PROGRAMMABLE NON-VOLATILE MEMORY

CROSS REFERENCE TO RELATED APPLICATIONS

This application is based upon and claims priority from prior European Application No. 01830418.8, filed Jun. 21, 2001, the disclosure of which is hereby incorporated by reference in its entirety.

BACKGROUND OF THE INVENTION

1. Field of the Invention

The present invention relates to a method of refreshing an electrically erasable and programmable non-volatile memory.

2. Description of Related Art

Non-volatile memories, which can be erased and programmed electrically, are commonly used in several applications when the data stored in the memory must be preserved even if a power supply is off. For example, a flash memory is a particular type of $E^2PROM$, wherein each memory cell consists of a single transistor (typically a floating gate MOS transistor). The transistors of the flash memory are programmed by injecting an electric charge into their floating gates. Conversely, the transistors are erased by discharging their floating gates; generally, the flash memory is erased in blocks (or sectors) formed by a few thousands of transistors. The electric charge in the floating gate of each transistor modifies its threshold voltage, so as to define different logic values. This results in a very simple structure of the flash memory, which can be manufactured at low cost and with high density. As a consequence, the flash memory is well suited to a number of end-product applications, such as PCs (Personal Computers), cellular phones, automotive devices, digital still cameras, and the like.

Data retention is one of the most important problems of the flash memories. In fact, the transistors are subjected to different electric stresses during operation of the flash memory; these stresses may cause injection of electric charge into their floating gates (with an undesired programming of the transistors), or they may cause loss of the electric charge stored therein (with an undesired erasure of the transistors).

This problem is particular acute in modern flash memories, which feature a very thin oxide layer. Moreover, the problem is exacerbated in multilevel flash memories wherein the gap between reference voltages defining adjacent logic values is strongly reduced (down to 0.3 V); in this case, even a small drift of the threshold voltage of the transistor (for example, of 0.1 V) may change its logic value.

In order to prevent any loss of data stored in the flash memory, a refreshing procedure may be carried out periodically. The refreshing procedures known in the art require the steps of copying a sector of the flash memory onto a volatile memory, erasing the whole sector, and then restoring the data from the volatile memory; therefore, any power supply cut during the refreshing procedure may cause a loss of data stored in the volatile memory and then the impossibility of restoring the data onto the flash memory.

Different architectures allowing each single transistor to be selectively erased have been also proposed. For example, the U.S. Pat. No. 6,160,739, discloses a flash memory with source lines (coupled to sources of the transistors of corresponding columns) that extend perpendicularly to word lines (coupled to control gates of the transistors of corresponding rows). In this way, each couple source line/word line identifies a single transistor, which can be erased individually applying suitable voltages to the corresponding source line and word line.

In a different architecture, known as Virtual Ground, each bit line is connected to an active area (drain or source) of the transistors of two adjacent columns, so as to be used alternatively for contacting the drain terminals or the source terminals of the transistors.

Another solution is disclosed in the U.S. Pat. No. 5,656,840, and consists of associating a select transistor to each memory cell.

However, none of the solutions proposed in the prior art in any way addresses the data retention problem described in the foregoing. Particularly, the cited documents are completely silent on any refreshing procedure of the flash memory.

Accordingly, a need exists to overcome the above-mentioned drawbacks and to provide a method of refreshing an electrically erasable and programmable non-volatile memory.

SUMMARY OF THE INVENTION

Briefly, the present invention provides a method of refreshing an electrically erasable and programmable non-volatile memory having a plurality of memory cells, the method including the steps of: verifying whether a memory cell has drifted from a correct condition (i.e., a predetermined voltage and/or predetermined voltage range), and individually restoring the correct condition of the memory cell if the result of the verification is positive.

Moreover, the present invention also provides a corresponding electrically erasable and programmable non-volatile memory.

BRIEF DESCRIPTION OF THE DRAWINGS

The subject matter which is regarded as the invention is particularly pointed out and distinctly claimed in the claims at the conclusion of the specification. The foregoing and other features, and advantages of the invention will be apparent from the following detailed description taken in conjunction with the accompanying drawings, in which:

DETAILED DESCRIPTION OF AN EMBODIMENT

Figure 1:
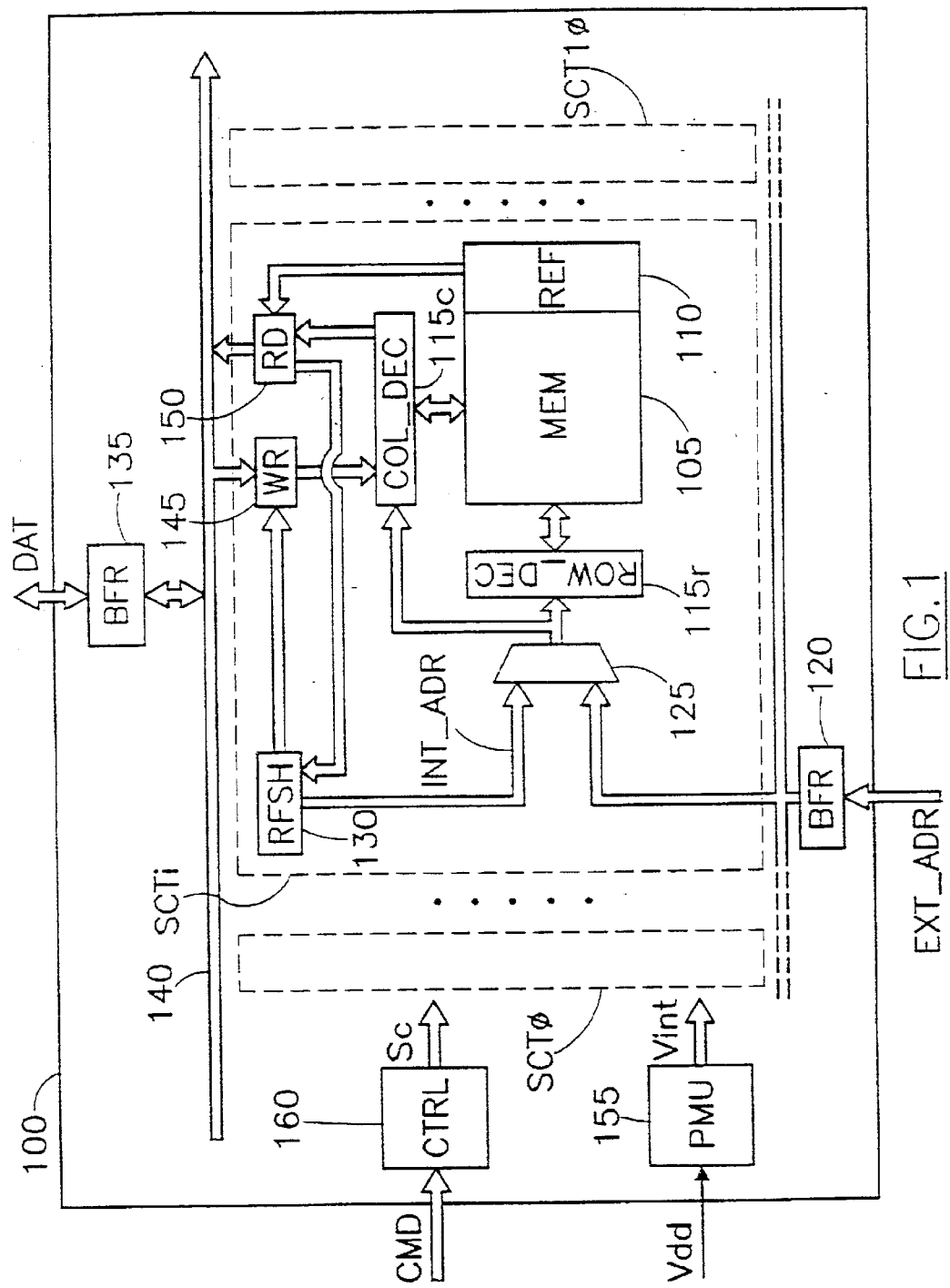
FIG. 1 is a schematic block diagram of a flash memory in which the method of the invention is applicable.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality. In the drawing like numerals refer to like parts through several views.

With reference in particular to FIG. 1, a flash memory 100 is shown. The flash memory 100 is segmented into a plurality of sectors SCTi (for example, eleven sectors with i=0 . . . 10); a generic sector SCTi includes a matrix (MEM) 105 of memory cells, with a respective array (REF) 110 of reference cells. Typically, the flash memory 100 has an asymmetric architecture, wherein a first sector has a reduced capacity in comparison with the other sectors (for example, 8 K bytes for storing parameters and 64 K bytes for storing micro-code, respectively).

As described in detail in the following, the matrix 105 has a plurality of rows and a plurality of columns (512 rows× 1024 columns for a micro-code sector of the example at issue). A column decoder (COL_DEC) 115c and a row decoder (ROW_DEC) 115r are used to select the columns and the rows, respectively, of the matrix 105.

An external address (EXT_ADR) is latched in a buffer (BFR) 120. The external address EXT_ADR latched in the buffer 120 is provided to a first input of a multiplexer 125; a second input of the multiplexer 125 receives an internal address (INT_ADR) from a refreshing unit (RFSH) 130. The multiplexer 125 selectively transmits the external address EXT_ADR or the internal address INT_ADR; a first portion of the transmitted address (EXT_ADR or INT_ADR) is supplied to the column decoder 115c, and a second portion of the transmitted address is supplied to the row decoder 115r.

An input/output block of data (DAT) is latched in a further buffer (BFR) 135, which is connected to an internal data bus 140. A writing unit (WR) 145 receives a block of data to be written onto the matrix 105 from the bus 140, and drives the column decoder 115c accordingly; the writing unit 145 is also coupled to the refreshing unit 130. The column decoder 115c and the reference array 110 are connected to respective inputs of a reading unit (RD) 150, which sends a block of data read from the matrix 105 onto the bus 140 and to the refreshing unit 130.

A power management unit (PMU) 155 receives an external power supply voltage Vdd (for example, 3 V relative to a reference voltage or ground). The power management unit 115 generates a plurality of internal supply voltages (denoted as Vint) by means of respective charge pumps. Operation of the flash memory 100 is controlled by a state machine (CTRL) 160, which outputs a plurality of control signals (denoted as Sc) in response to external command signals (denoted as CMD).

Similar considerations apply if the flash memory has a different structure and capacity (for example, with the reference cells replaced by corresponding circuits), if the flash memory includes a different number of sectors (down to a single sector in a flash memory with a bulk architecture), if the sectors are uniform, if the matrix has a different number of rows and columns, and the like. Alternatively, the method of the invention is used in a flash memory of a different type, in an $E^2PROM$, or more generally in any electrically erasable and programmable non-volatile memory.

Figure 2:
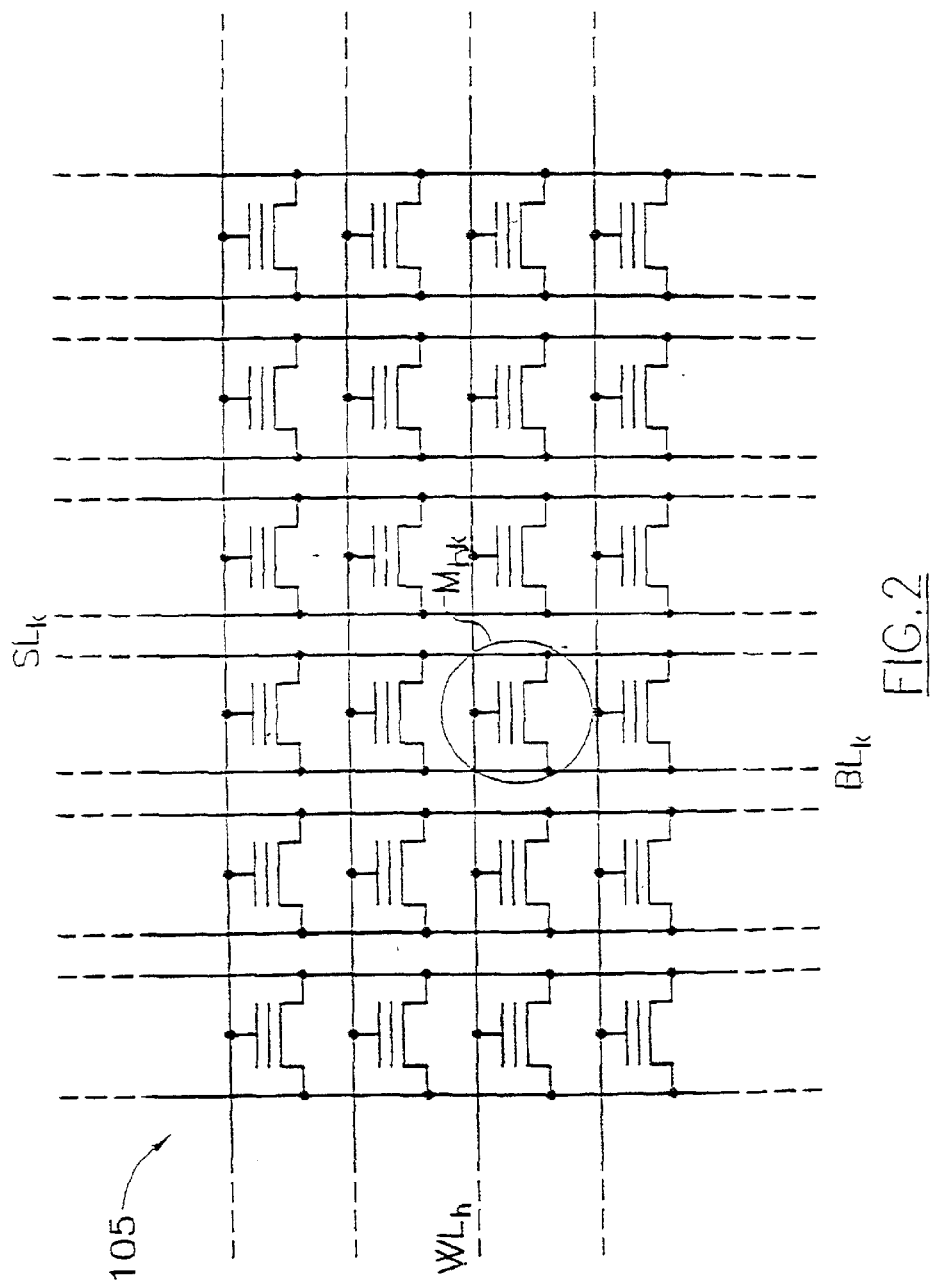
FIG. 2 depicts a sector of the flash memory.

As shown in FIG. 2, each memory cell consists of a FAMOS (Floating-gate, Avalanche-injection MOS transistor) Mhk (with h=0 . . . 511 and k=0 . . . 1023 in the example at issue). The transistors Mhk of each row have a control gate terminal connected to a respective word line WLh (coupled to the row decoder); the transistors Mhk of each column have a drain terminal connected to a respective bit line BLk and a source terminal connected to a respective source line SLk (both of them coupled to the column decoder). In this way, each couple word line/bit line and each corresponding couple word line/source line addresses a single transistor Mhk of the matrix 105.

Figure 3:
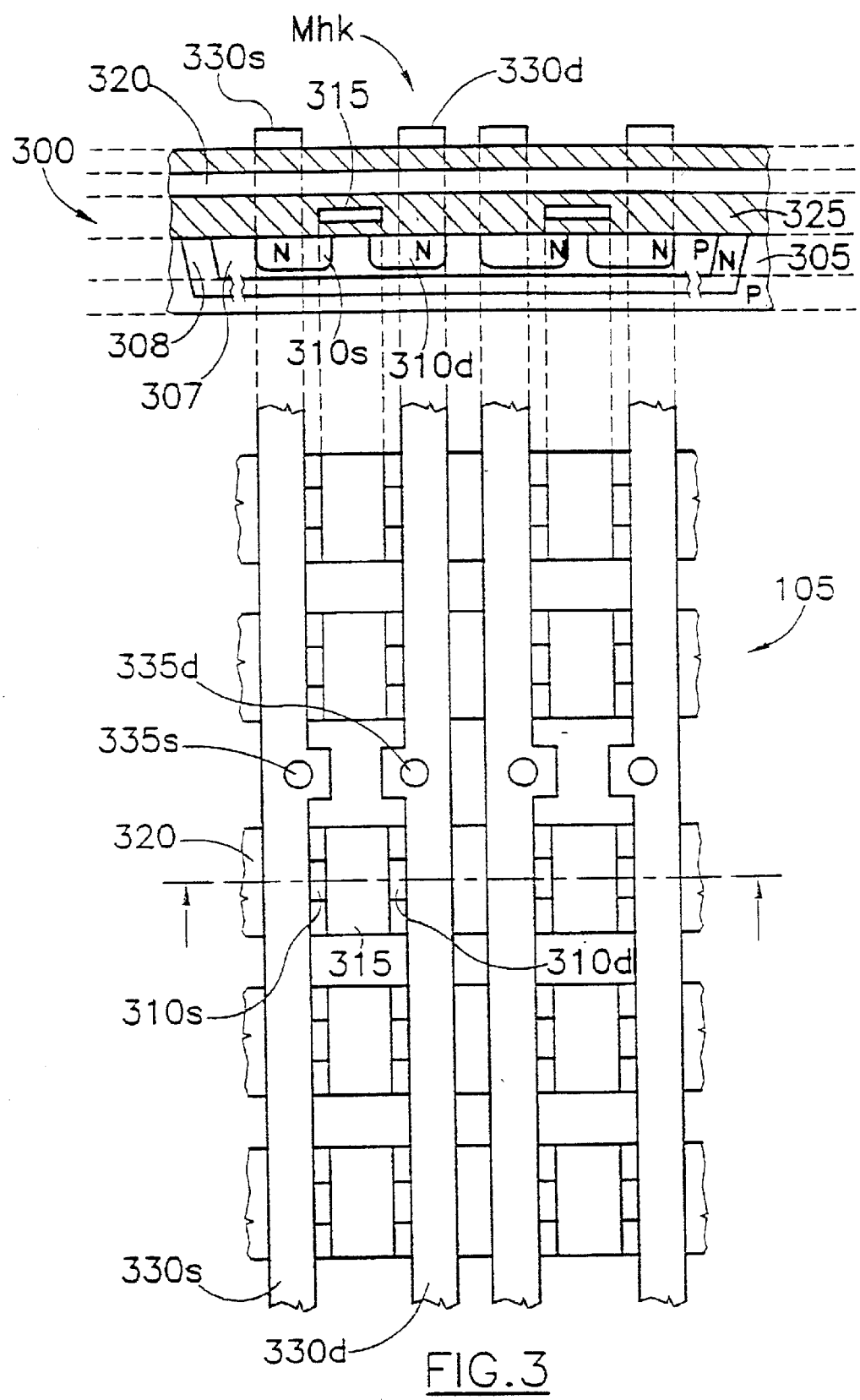
FIG. 3 shows the structure of the sector in plan view and cross-section view.

Referring now to FIG. 3, the flash memory is integrated in a chip of semiconductor material 300 with a substrate 305 of a given type of conductivity (for example, P). Each sector of the matrix 105 is made in a well (body or bulk) 307 of the same type of conductivity (P-well); the body 307 is in turn formed in a further well 308 of the opposite type of conductivity (N), so as to be insulated from the substrate 305. Each transistor Mhk includes a source region 310s and a drain region 310d of the N type, which are formed in the body 307. A floating gate 315 and a control gate 320 (composed of polysilicon) are stacked over a channel formed in the body 307 between the source region 310s and the drain region 310d. The floating gate 315 is insulated from the control gate 320 by an interpoly oxide layer, while it is insulated from the channel by a thin tunnel oxide layer (denoted as 325 in the figure).

The control gates 320 of the transistors of each row consist of a single polysilicon bar running along the row, which bar defines the corresponding word line. The source regions 310s and the drain regions 310d of the transistors Mhk of each column consist of respective strip-shaped regions of semiconductor material (of the N type) running along the column, which regions define the source line and the bit line, respectively. A metal track 330s and a metal track 330d (made in a single layer on the oxide layer 325) run over the source strip and the drain strip, respectively. The metal tracks 330s and 330d contact the drain and source strips through via-holes 335s and 335d, respectively; the via-holes 335s,335d are arranged between two adjacent transistors Mhk (for example, every 4–10 rows).

Figure 4:
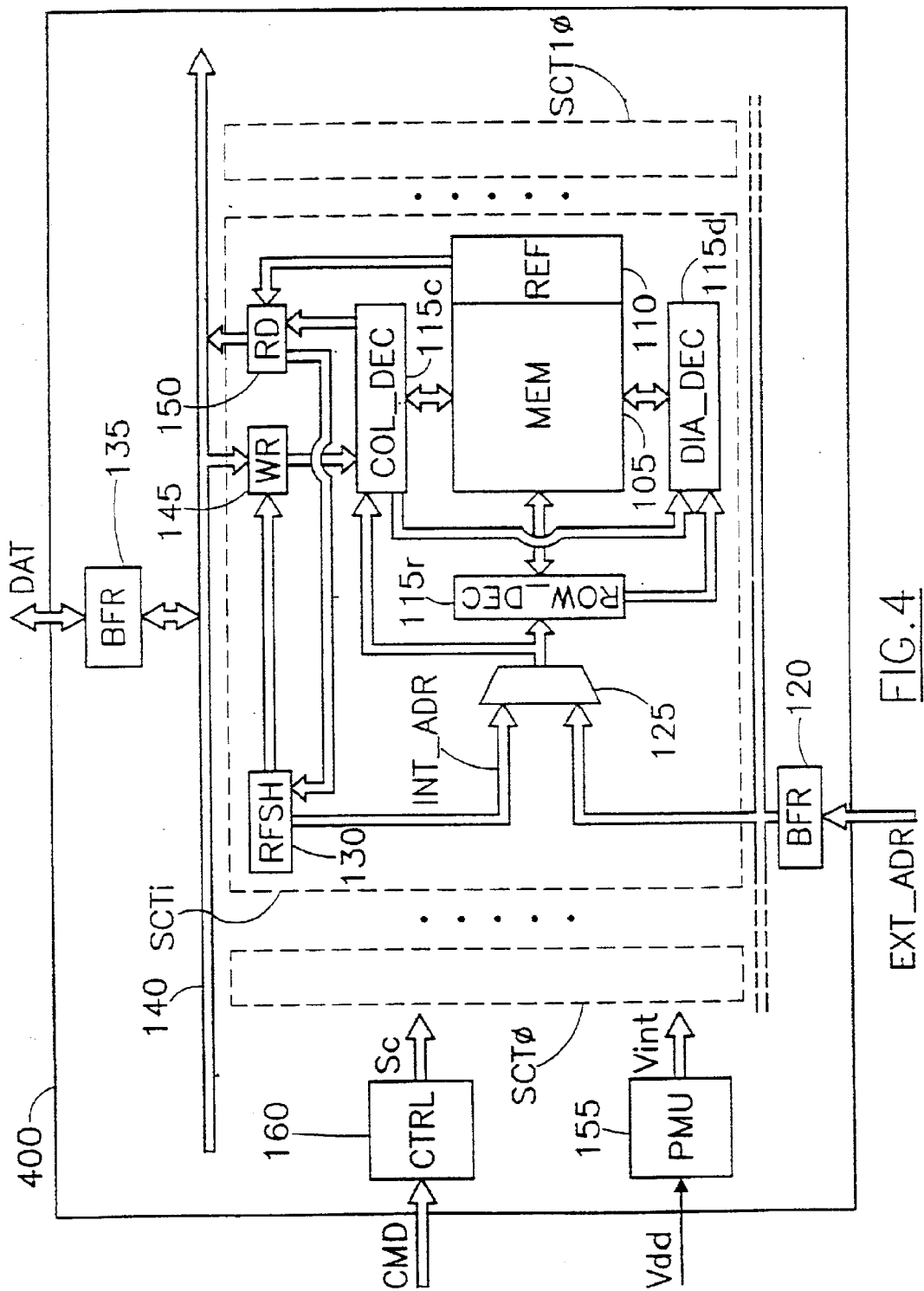
FIG. 4 is a schematic block diagram of a different embodiment of the flash memory.
Figure 5:
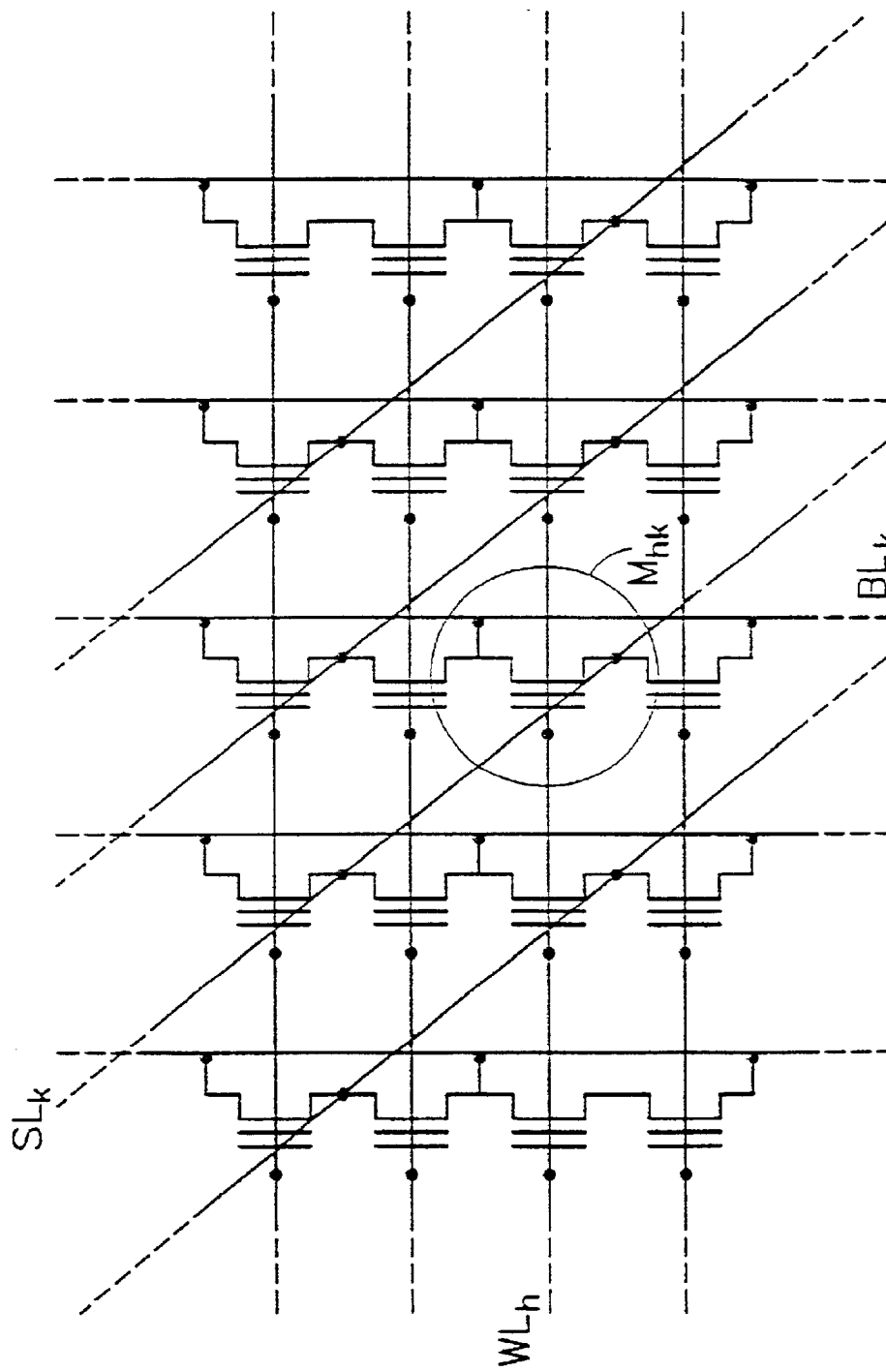
FIG. 5 depicts a sector of this flash memory.
Figure 6:
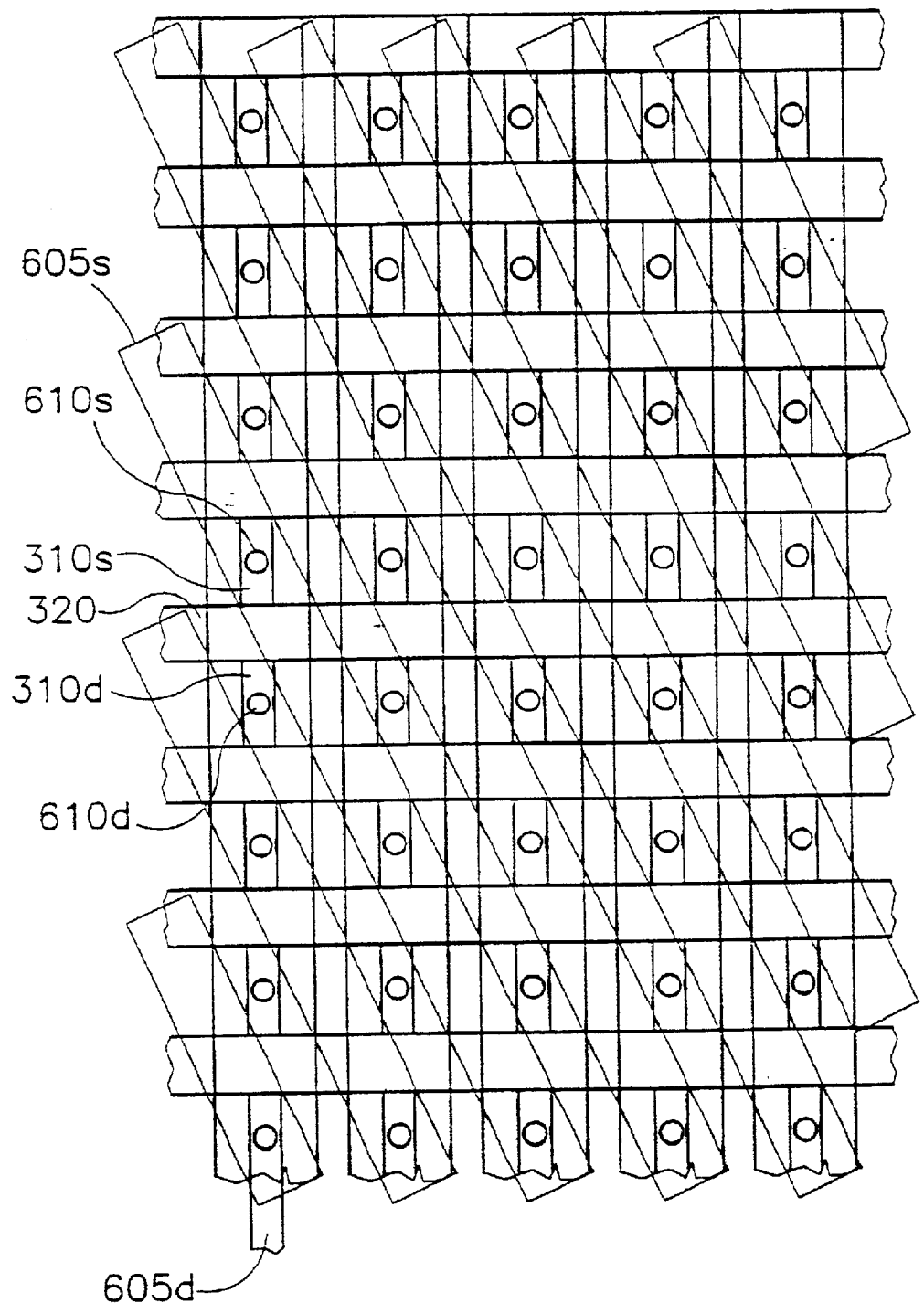
FIG. 6 shows the structure of the sector in plan view.

A different structure of the flash memory is illustrated in FIGS. 4–6 (the elements corresponding to the ones shown in the FIGS. 1–3 are denoted with the same references, and their explanation is omitted for the sake of simplicity). Considering in particular FIG. 4, each sector SCTi further includes a diagonal decoder (DIA_DEC) 115d, which is used to select the source lines of the matrix 105. The diagonal decoder 115d is driven by the row decoder 115r and the column decoder 115c.

As shown in FIG. 5, the transistors Mhk of each row have the control gate terminal connected to the respective word line WLh (coupled to the row decoder); the transistors Mhk of each column have the drain terminal connected to the respective bit line BLk (coupled to the column decoder). The source lines SLk extend obliquely to the word lines WLh, along respective diagonals of the matrix 105; therefore, the transistors Mhk of each diagonal have the source terminal connected to the respective source line SLk (coupled to the diagonal decoder). It should be noted that the source line SLk associated with each transistor is uniquely determined by a respective couple word line/bit line.

With reference now to FIG. 6, the control gates 320 of the transistors of each row consist of a single polysilicon bar running along the row, which bar defines the corresponding word line. A metal track 605d runs over the drain regions 310d of the transistors of each column, and defines the corresponding bit line; the metal track 605d contacts the drain region 310d of each transistor of the column through a respective via-hole 610d. A further metal track 605s (formed in a different layer) runs over the source regions 310s of the transistors of each diagonal, and defines the corresponding source line; the metal track 605s contacts the source region 310s of each transistor of the diagonal through a respective via-hole 610s.

Figure 7:
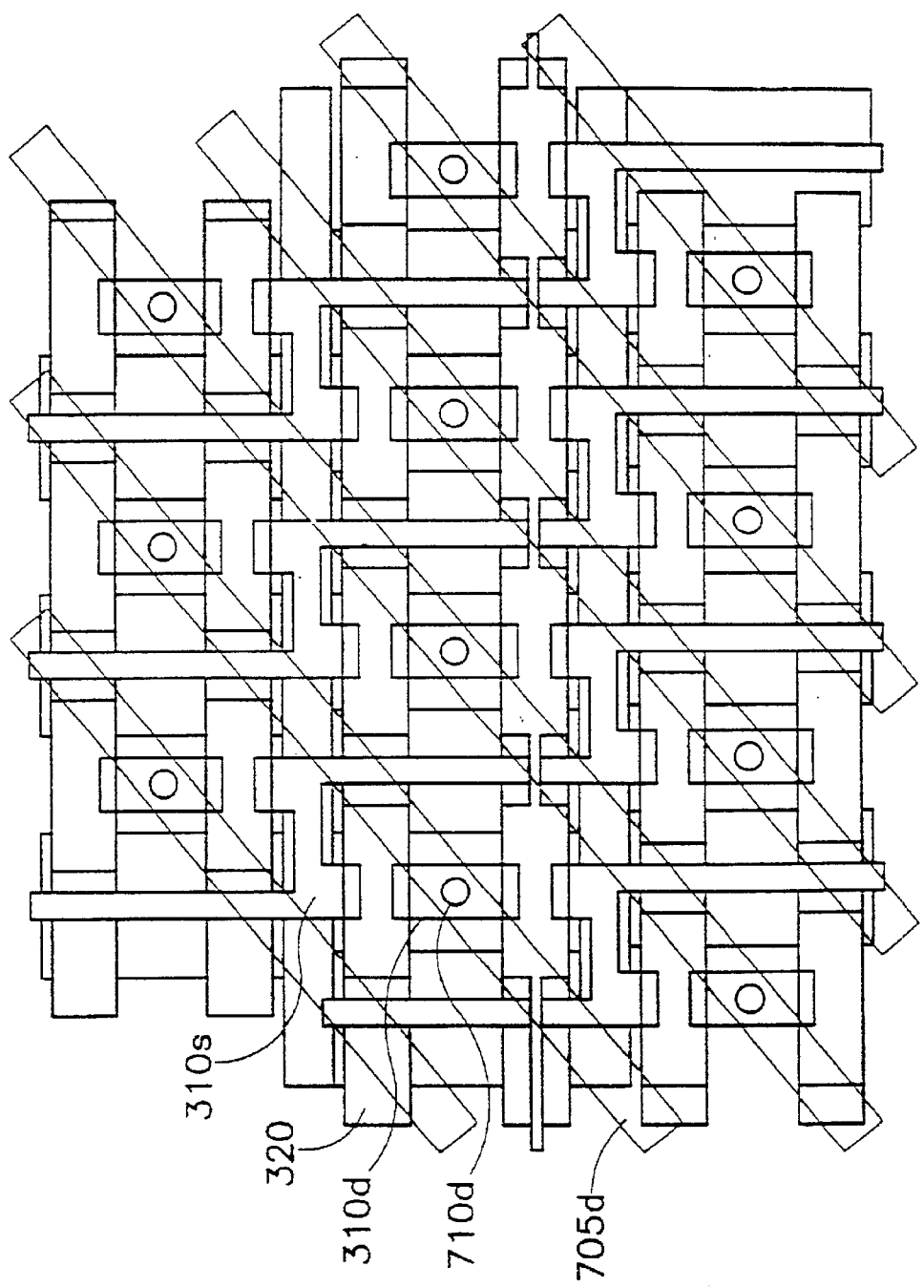
FIG. 7 is a plan view of a sector with a further different structure.

Alternatively, as shown in FIG. 7, both the bit lines and the source lines extend obliquely to the word lines; the bit lines extend along respective right-sloping diagonals, whereas the source lines extend along respective left-sloping diagonals. More specifically, the rows of the matrix are staggered to each other. The control gates 320 of the transistors of each row consist of a single polysilicon bar running along the row, which bar defines the corresponding word line. A metal track 705d runs over the drain regions 310d of the transistors of each right-sloping diagonal, and defines the corresponding bit line; the metal track 705d contacts the drain region 310d of each transistor of the right-sloping diagonal through a respective via-hole 710d. The source regions 310s of the transistors of each left-sloping diagonal consist of a respective stair-shaped region of the N type running along the left-sloping diagonal, which region defines the corresponding source line.

Figure 8:
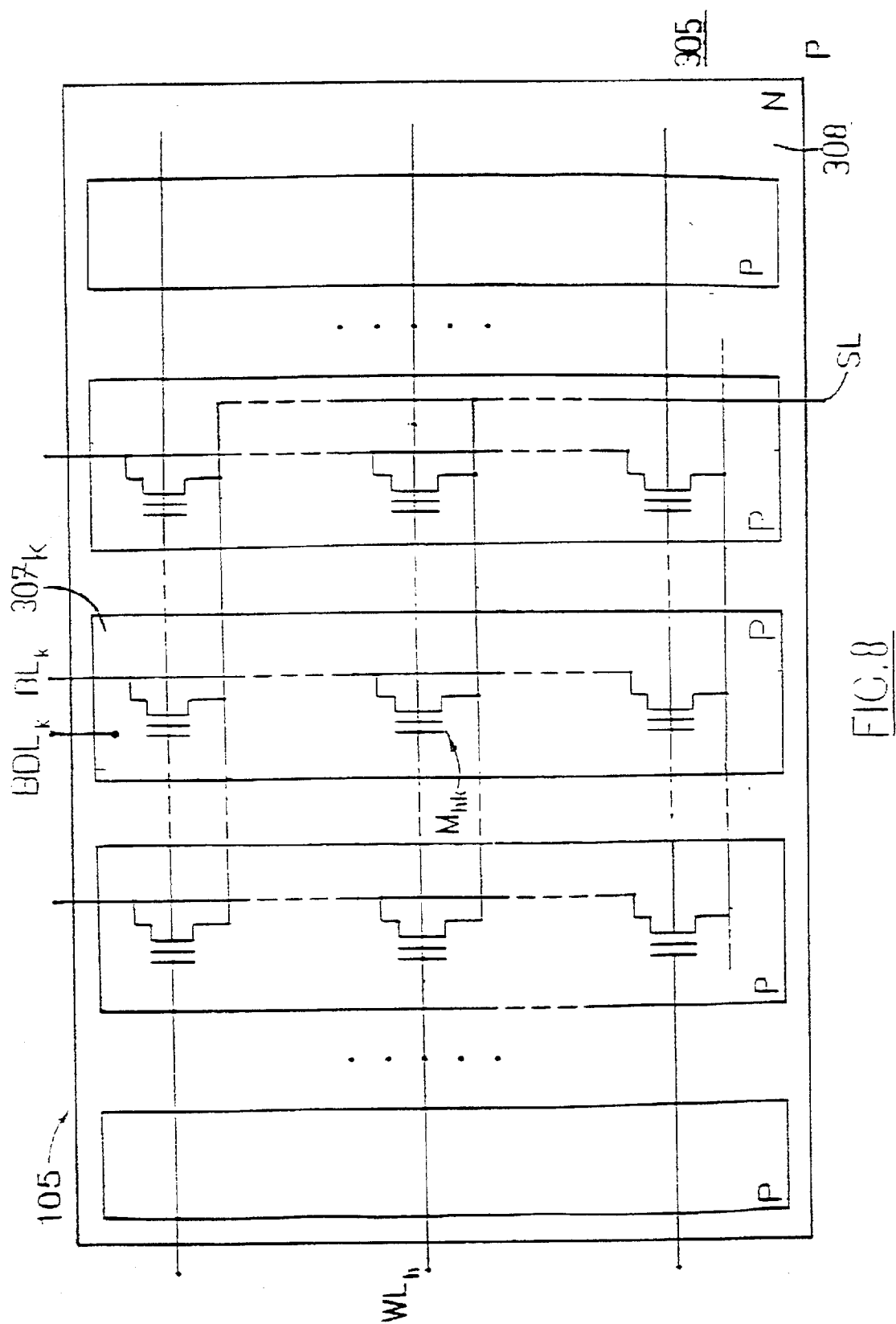
FIG. 8 depicts an alternative structure of the sector in plan view.

Moving now to FIG. 8, a different structure of a sector in the flash memory with the architecture of FIG. 1 is illustrated (the elements corresponding to the ones shown in FIG. 3 are denoted with the same references and their explanation is omitted for the sake of simplicity). In this case, the transistors Mhk of each column are made in a respective insulated body (P-well) 307k; the bodies 307k are strip-shaped and extend perpendicularly to the word lines WLh (in the direction of the bit lines BLk). A distinct body line BDLk is used to connect each body 307k individually to the column decoder. The source terminals of all the transistors Mhk are connected to a common source line SL (typically taken at ground).

Similar considerations apply if P-type regions are provided instead of the N-type regions and vice-versa, if the metal tracks are replaced with equivalent conductive tracks, if the memory cells are formed with different elements (for example, programmed by tunneling), and the like. Alternatively, each transistor has a charge-trapping layer (for example, made of silicon nitride) instead of the floating gate, such as in a dual bit (or mirror bit) memory.

In all the embodiments of the flash memory described above, each transistor stores a bit. The transistor in a non-programmed (or erased) condition has a low threshold voltage. Therefore, when the transistor is selected and biased for reading it is conductive and a first logic value (1) is detected by the reading unit. The transistor is programmed by applying a high (positive) biasing voltage between the drain terminal and the control gate terminal; this voltage supplies sufficient energy to some of the electrons (hot electrons) flowing through the channel of the transistor to cause their injection into the floating gate. The electric charge transferred into the floating gate is retained for any practical time period. As a consequence, the transistor in a programmed condition has a high threshold voltage; in this way, when the programmed transistor is selected and biased for reading it is non-conductive and a second logic value (0) is detected by the reading unit. The programmed transistor is erased by discharging its floating gate. Particularly, a high (negative) biasing voltage is applied between the source terminal (or the body) and the control gate terminal; this voltage generates a low Fowler-Nordheim current by quantum-mechanical tunneling (flowing between the floating gate and the source terminal/body), which current removes the electric charge from the floating gate of the transistor.

The flash memory is programmed and read as usual. Particularly, during a programming procedure a bit line of a selected transistor is biased to a voltage of 4.5 V, while the other bit lines are left floating; all the source lines are kept at ground (0 V). A programming pulse with a trapezoidal shape varying from a voltage of 3 V to a voltage of 8.5 V is applied to the word line of the selected transistor, while the other word lines are kept at ground. In this way, only the selected transistor is subjected to a biasing condition suitable for injecting electric charge into its floating gate; moreover, the shape of the programming pulse ensures that the electric field at the oxide layer is kept substantially constant while the electric charge in the floating gate increases.

During a reading procedure, the bit line of a selected transistor is biased to a voltage of 1 V, while the other bit lines are left floating; all the source lines are kept at ground. The word line of the selected transistor is biased to a voltage of 5 V, while the other word lines are kept at ground. The current flowing through the bit line of the selected transistor is compared with a current supplied by a corresponding reference cell, in order to verify if the threshold voltage of the selected transistor is lower (logic value 1) or higher (logic value 0) than a reading reference voltage (for example, 3 V).

Conversely, the flash memory may be erased a bit at a time. With reference in particular to the flash memory of the FIGS. 1–7, during an erasing procedure of a selected transistor (identified by a selected word line and a selected source line/bit line) the bit lines of the sector are left floating. The selected word line is biased to a voltage of –8 V, while the other word lines are kept at ground. A first erasing pulse with a value of 3 V is applied to the selected source line, while the other source lines are kept at ground. In this way, in spite of the fact that the entire selected word line is biased to the voltage of –8 V, only the transistor of the selected source line (to which the erasing pulse is applied) is subjected to a biasing condition suitable for removing electric charge from its floating gate.

The selected transistor is then checked in order to verify the completion of the erasing procedure. More specifically, the selected transistor is biased for reading (as described above); the current flowing through the bit line of the selected transistor is compared with a current supplied by a corresponding reference cell, in order to verify whether the threshold voltage of the selected transistor has fallen below a pre-set value slightly lower than the reading reference voltage (for example, 2.5 V).

If the selected transistor has not been erased, the steps described above are repeated increasing the value of the erasing pulse (voltage on the selected source line), in order to approximate a trapezoidal wave shape providing a constant electric field at the oxide layer while the electric charge in the floating gate decreases. If the selected transistor is not erased before the erasing pulse reaches a pre-set maximum value (8.5 V in the example at issue), or after a further number of erasing pulses at the maximum value, the erasing procedure is aborted and the flash memory enters an error condition.

A similar procedure is applied to the flash memory of the FIG. 8. In this case, a selected transistor (identified by a selected word line and a selected body line/bit line) is erased applying the erasing pulses to the selected body line (while the common source line is kept at ground). Therefore, in spite of the fact that the entire selected word line is biased to the voltage of −8 V, only the transistor of the selected body line (to which the erasing pulses are applied) is subjected to a biasing condition suitable for removing electric charge from its floating gate.

During the programming procedure, the other transistors belonging to the word line of the selected transistor are subjected to a gate stress (being the word line biased to a voltage of 8.5 V); in a similar manner, the other transistors belonging to the bit line of the selected transistor are subjected to a drain stress (being the bit line biased to a voltage of 4.5 V). After repeated cycles of programming of the flash memory, this may cause injection of electric charge into the floating gates of the transistors, with an undesired programming thereof.

Moreover, during the erasing procedure of the flash memory described above, the other transistors belonging to the word line of the selected transistor are subjected to a gate stress (being the word line biased to a voltage of −8 V). At the same time, in the flash memory of FIGS. 1–7 the other transistors belonging to the source line of the selected transistor are subjected to a source stress (being the source line biased to a voltage up to 8.5 V); in a similar manner, in the flash memory of FIG. 8 the other transistors belonging to the body line of the selected transistor are subjected to a body stress. After repeated cycles of erasure of the flash memory, this may cause loss of the electric charge stored in the floating gate of the transistors, with an undesired erasure thereof.

The concepts exposed in the foregoing are readily extended to a multilevel flash memory. In this case, each transistor may be programmed to multiple levels, each one associated with a corresponding range of its threshold voltage; each level represents a different logic value. Typically, the number of levels is a power of 2; therefore, a transistor with $L=2^{BN}$ levels stores a logic value consisting of BN bits of information.

Figure 9:
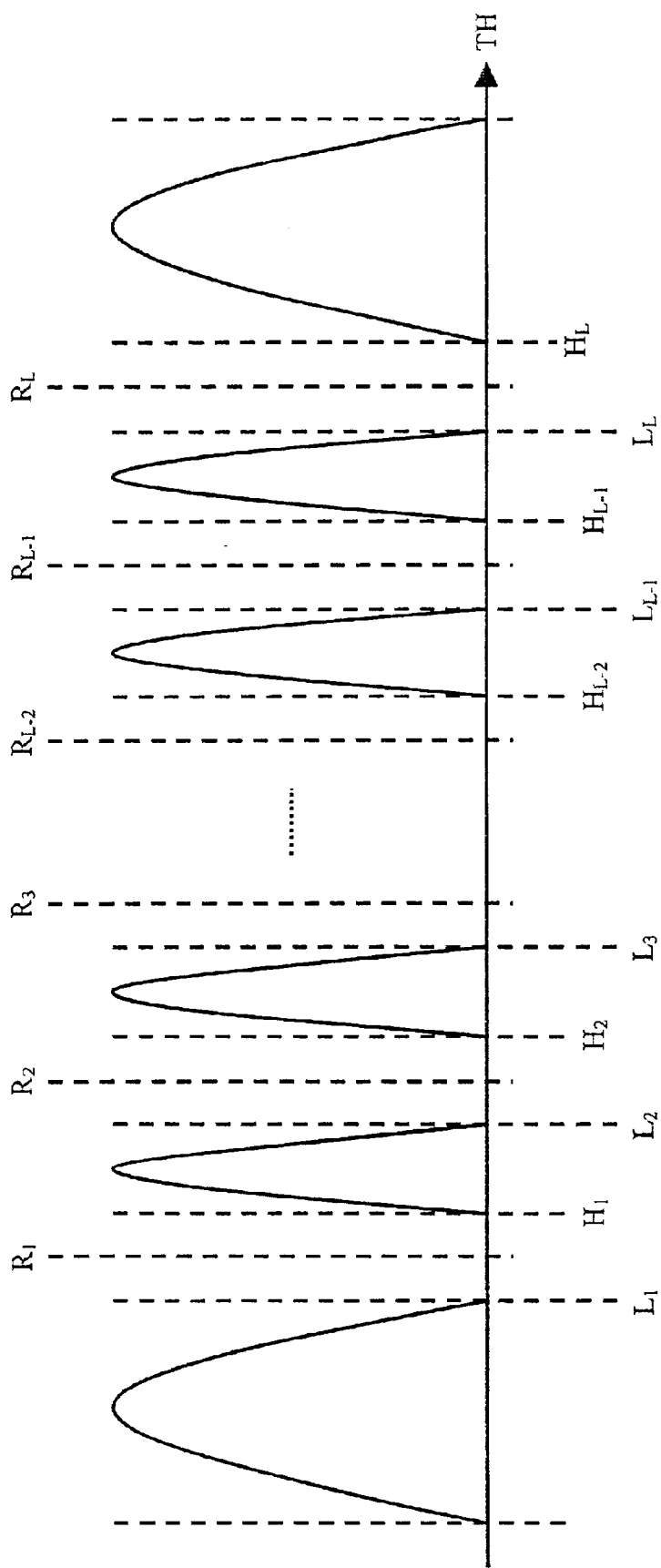
FIG. 9 illustrates the threshold voltage distribution in a transistor of a multilevel flash memory.

As shown in FIG. 9, each pair of adjacent logic values is discriminated by a corresponding reading reference voltage $R_j$ (with j=1 . . . L); in other words, the transistor is considered at the j-th level when its threshold voltage TH is comprised between the reference voltage $R_j$ and the reference voltage $R_{j+1}$ (with $R_0=0$ and $R_{L+1}=\infty$). A warning zone is defined around each reference voltage $R_j$; the warning zone is bounded by a low guard voltage $L_j$ and a high guard voltage $H_j$ (for example, with $L_j=R_j-0.1$ V and $H_j=R_j+0.1$ V). The transistor in a correct condition has the threshold voltage TH outside every warning zone, i.e., the voltage is within a predetermined voltage and/or predetermined voltage range. When the transistor has drifted away from the correct condition, its threshold voltage TH enters one of the adjacent warning zones. Particularly, if the threshold voltage TH is between the reference voltage $R_j$ and the high guard voltage $H_j$ we can assume that the floating gate of the transistor at the j-th level is loosing its electric charge; conversely, if the threshold voltage TH is between the low guard voltage $L_j$ and the reference voltage $R_j$ we can assume that the floating gate of the transistor at the (j−1)th level is increasing its electric charge.

Similar considerations apply if the erasing pulse is obtained by varying the voltage on the word line or on both the word line and the source line/body line, if different voltages are used (for example, with the source lines or the body lines distinct from the one of the selected transistor biased to a negative voltage during the erasing procedure, in order to reduce the gate stress on the transistors), if the programming and/or erasing pulses have a different value, if the warning zone is defined in another way, and the like.

Alternatively, equivalent programming, reading and/or erasing procedures are envisaged. For example, the success of the erasing is not checked, or a single trapezoidal erasing pulse is used; in this case, the transistor is checked in order to verify whether it has been over-erased, and therefore features a negative threshold voltage (depleted transistor), and it is possibly restored to a non-depleted condition by a (soft) programming operation.

Figure 10:
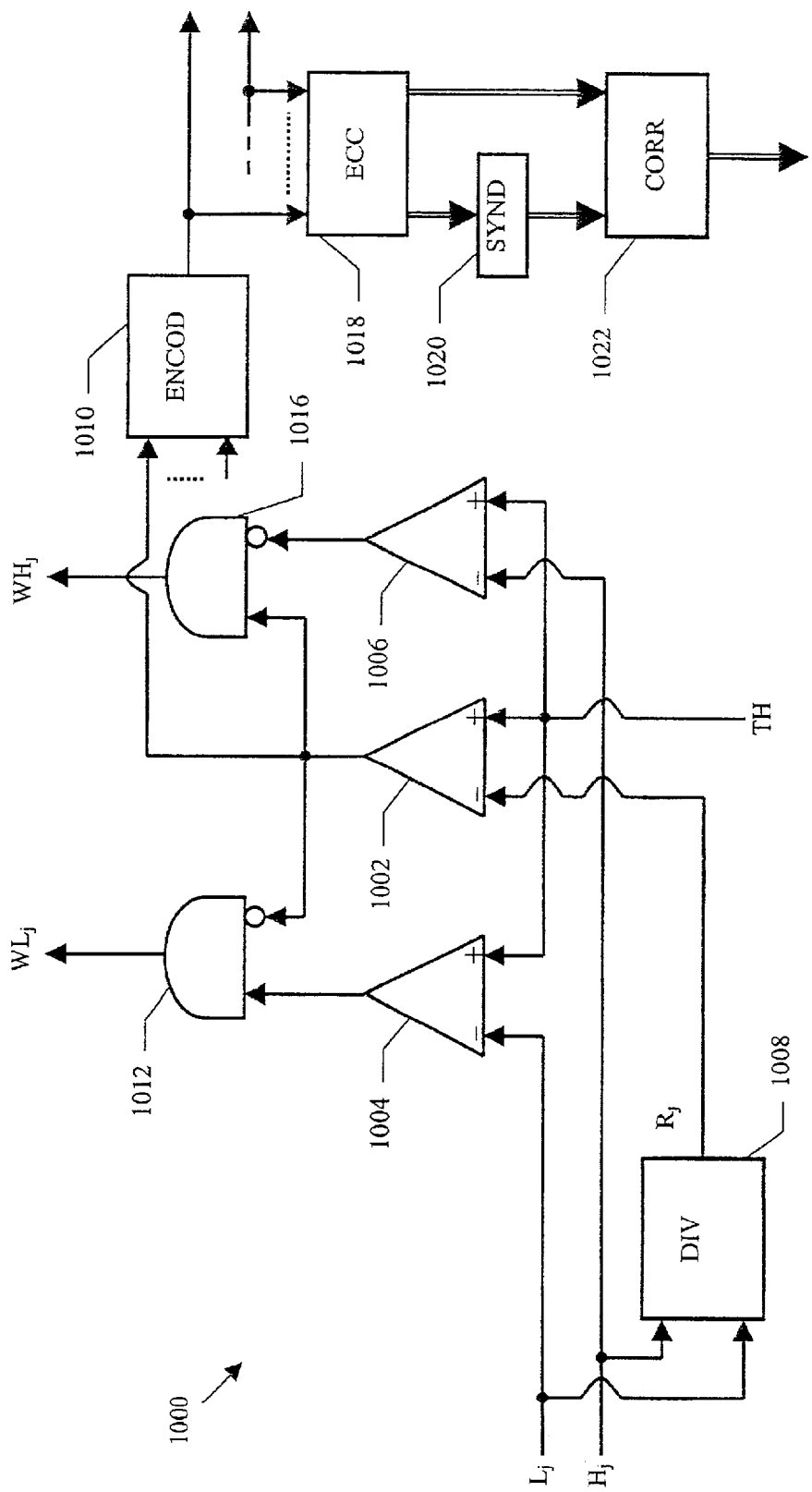
FIG. 10 shows the functional blocks of a particular of a reading unit included in the flash memory.

With reference now to FIG. 10, the functional blocks of a particular of the reading unit are illustrated. The reading unit includes a series of sense amplifiers 1000 for outputting the bits of a word that are simultaneously read from the matrix. For the j-th level of each transistor of the word, the sense amplifier 1000 includes a main comparator 1002. The non-inverting input of the comparator 1002 is connected to the selected bit line (through the column decoder), so as to be input the threshold voltage TH of the transistor to be read; at the same time, the respective reference voltage $R_j$ is supplied to the inverting input of the comparator 1002. The low guard voltage $L_j$ and the threshold voltage TH are supplied to the inverting input and to the non-inverting input, respectively, of a further comparator 1004. Moreover, the high guard voltage $H_j$ and the threshold voltage TH are supplied to the inverting input and to the non-inverting input, respectively, of a still further comparator 1006.

The low guard voltage $L_j$ and the high guard voltage $H_j$ are generated from corresponding reference cells directly. A computational block (DIV) 1008 obtains the reference voltage $R_j$ from the low guard voltage $L_j$ and the high guard voltage $H_j$; for example, assuming that the reference voltage $R_j$ has a value in the middle of the low guard voltage $L_j$ and the high guard voltage $H_j$, the computational block 1008 implements the following formula:

$$R_j=(L_j+H_j)/2$$

The output terminal of the comparator 1002 provides a signal that is asserted when the threshold voltage TH exceeds the reference voltage $R_j$ (TH>$R_j$); all the signals associated with each transistor are supplied to an encoder 1010, which generates a representation of the corresponding bits stored in the transistor.

The output terminal of the comparator 1004 provides a signal that is asserted when the threshold voltage TH exceeds the low guard voltage $L_j$ (TH>$L_j$). The inverted output terminal of the comparator 1002 and the output terminal of the comparator 1004 are connected to corresponding input terminals of an AND gate 1012. The AND gate 1012 generates a signal $WL_j$, which is asserted when the threshold voltage TH is comprised between the low guard voltage $L_j$ and the reference voltage $R_j$ ($L_j$<TH<=$R_j$). The output terminal of the comparator 1006 likewise provides a signal that is asserted when the threshold voltage TH exceeds the high guard voltage $H_j$ (TH>Hj). The output terminal of the comparator 1002 and the inverted output terminal of the comparator 1006 are connected to corresponding input terminals of a further AND gate 1016. The AND gate 1016 generates a signal $WH_j$, which is asserted when the threshold voltage TH is comprised between the reference voltage $R_j$ and the high guard voltage $H_j$ ($R_j$<TH<=$H_j$).

The reading unit also implements an Error Correction Code (ECC) facility. The error correction code adds redundancy information to any word; this redundancy information is used to identify and correct (if possible) any error in the word. Particularly, the word read from the matrix and the corresponding redundancy information are transmitted to an ECC decoder 1018. The ECC decoder 1018 calculates a syndrome for the word, which syndrome is provided to a corresponding decoder (SYND) 1020. A correction unit (CORR) 1022 is input the word to be corrected from the ECC decoder 1018, and a series of correction bits from the syndrome decoder 1020. The unit 1022 corrects the word (if possible) according to the corresponding correction bits. The corrected word so obtained is then sent onto the internal data bus of the flash memory; at the same time, all the signals $WL_j$ and $WH_j$, the representation of the bits stored in the selected transistors, and the corrected word are provided to the refreshing unit.

Similar considerations apply if the reading unit has an equivalent structure, if a single sense amplifier is associated with each selected transistor (comparing its threshold voltage with the different reference voltages in sequence), if the low guard voltage and the high guard voltage are obtained from the reference voltage adding and subtracting, respectively, a delta voltage (or more generally, if one or more of these voltages are obtained from the others), if the word is corrected in a different manner, and the like.

Figure 11A:
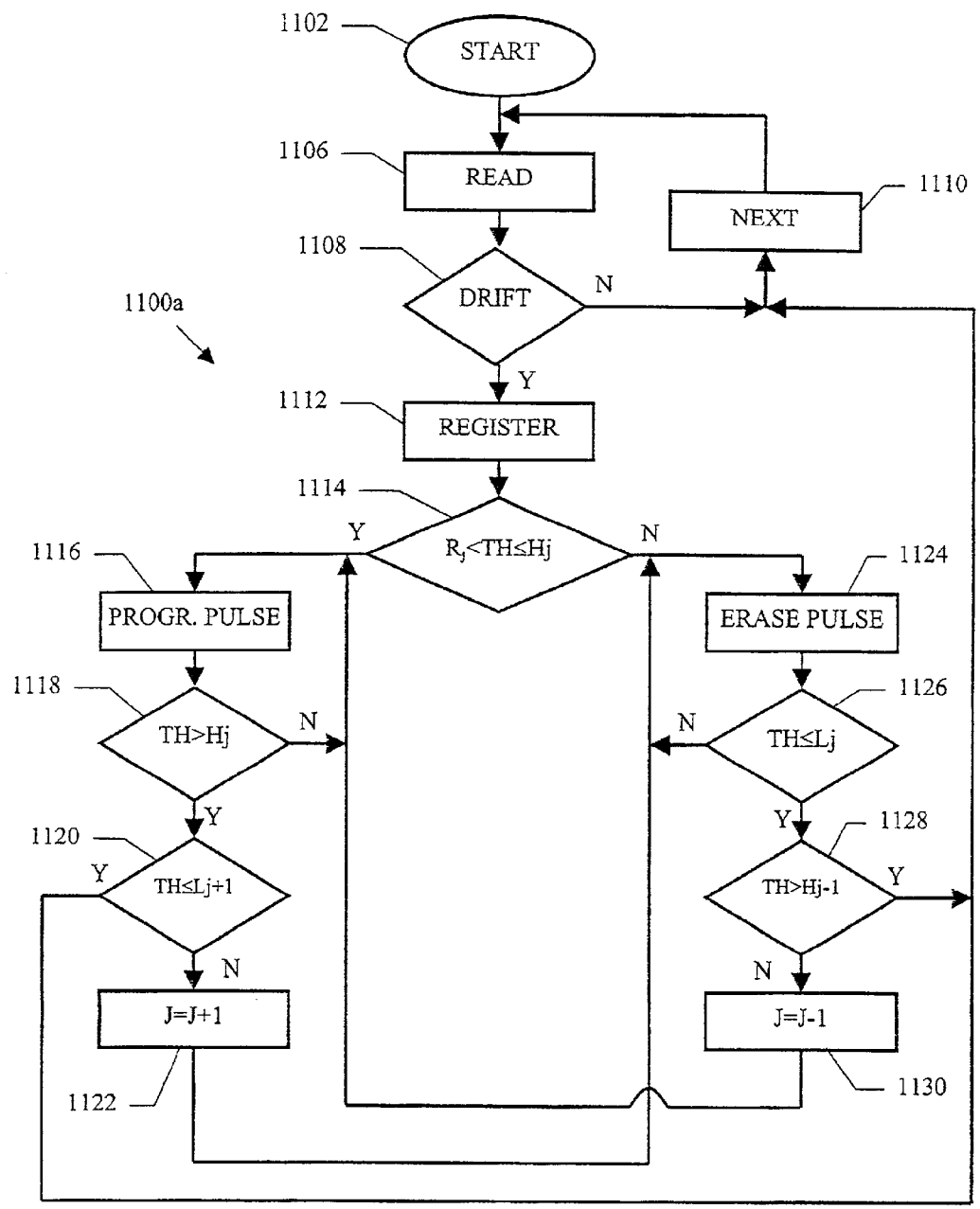
FIGS. 11a–11b are flow charts describing the logic of different refreshing methods.

In response to the signals received from the reading unit, the refreshing unit individually restores the correct condition of each transistor (if necessary), so as to prevent any loss of data stored in the flash memory. In a particular embodiment of the present invention, the transistors are refreshed continually in the background. As shown in FIG. 11a, the corresponding refreshing procedure performs a method 1100a that begins at block 1102. A transistor (starting from the first row and the first column) is selected and read at block 1106 (comparing its threshold voltage TH simultaneously with every reference voltage $R_j$ and the corresponding low guard voltage $L_j$ and high guard voltage $H_j$). A test is made at decision block 1108 to determine whether the transistor has drifted from its correct condition (that is, the corresponding threshold voltage has entered a warning zone). If not, a next transistor of the matrix is selected at block 1110, and the method then returns to block 1106 for repeating the operations described above.

Conversely, the method descends into block 1112 wherein an identification of the involved warning zone is saved in a register of the refreshing unit. Continuing to decision block 1114, the method verifies whether the threshold voltage TH is comprised between the reference voltage $R_j$ and the high guard voltage $H_j$ (signal $WH_j$ asserted). If so, the blocks 1116–1122 are executed; conversely, the blocks 1124–1130 are executed.

Considering now block 1116 ($R_j$<TH<=$H_j$), a programming pulse is applied to the selected transistor (between its drain terminal and its control gate terminal). The programming pulse is defined so as to inject a small amount of electric charge into the floating gate of the selected transistor; for example, the programming pulse has a value of 8.5 V and a length of 1–2 ms (so as to increase the threshold voltage TH of the selected transistor of 5–20 mV). The method then verifies at block 1118 whether the threshold voltage TH is over the high guard voltage H. If not, the method returns to block 1116, in order to apply a further programming pulse to the selected transistor.

As soon as the threshold voltage TH has been restored over the high guard voltage $H_j$, a test is made at decision block 1120 to determine whether the threshold voltage TH is below the next low guard voltage $L_{j+1}$. If so, the method returns to block 1110, in order to repeat the operations described above on a next transistor. Conversely, the identification of the involved warning zone is updated accordingly in the register of the refreshing unit at block 1122 (j=j+1); the method then proceeds to block 1124. The same block 1124 is also reached from decision block 1114 when the threshold voltage TH of the selected transistor is comprised between the low guard voltage $L_j$ and the reference voltage $R_j$ (signal $WL_j$ asserted).

Considering now block 1124 ($L_j$<TH<=$R_j$), an erasing pulse is likewise applied to the selected transistor (between its source terminal/body and its control gate terminal). The erasing pulse is defined so as to remove a small amount of electric charge from the floating gate of the selected transistor; for example, the erasing pulse has a value of 10 V and a length of 1–2 ms (so as to reduce the threshold voltage TH of the selected transistor of 5–20 mV). The method then verifies at block 1126 whether the threshold voltage TH is below the low guard voltage $L_j$. If not, the method returns to block 1124, in order to apply a further erasing pulse to the selected transistor.

As soon as the threshold voltage TH has been restored below the low guard voltage $L_j$, a test is made at decision block 1128 to determine whether the threshold voltage TH is over the previous high guard voltage $H_{j-1}$. If so, the method returns to block 1110, in order to repeat the operations described above on a next transistor. Conversely, the identification of the involved warning zone is updated accordingly in the register of the refreshing unit at block 1130 (j=j−1); the method then proceeds to block 1116.

Figure 11B:
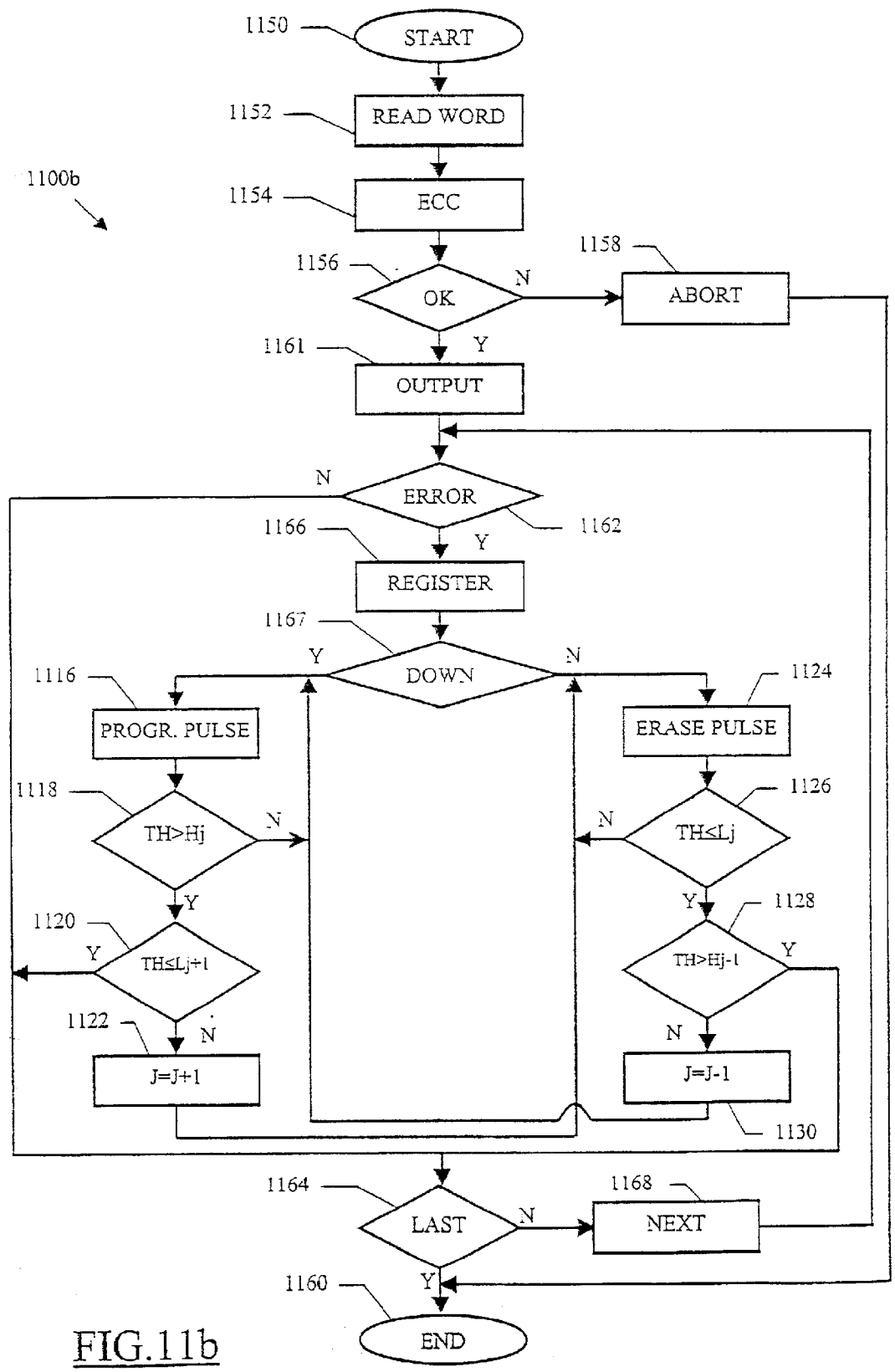

Alternatively, the transistors are refreshed whenever they are read. As shown in FIG. 11b, the reading procedure of a word implements a method 1100b that starts at block 1150. Proceeding to block 1152, the word and the associated redundancy information are read from the matrix. The corresponding error correction code is calculated at block 1154. The method then verifies at block 1156 whether the word can be corrected (if necessary). If not, the flash memory enters an error condition at block 1158; the method then ends at the final block 1160. Conversely, the (corrected) word is sent onto the internal data bus of the flash memory at block 1161.

A test is made at decision block 1162 to determine whether a selected transistor of the word (starting from the first one) is in an error condition (with the stored bits that are different from the ones generated by the error correction code). If not, the method descends into block 1164 (described in the following). Conversely, the method enters block 1166, wherein an identification of the correct level of the threshold voltage TH is saved in a register of the refreshing unit. Proceeding to block 1167, the threshold voltage of the selected transistor is compared with the reference voltage of the correct level. The blocks 1116–1122 or the blocks 1124–1130 (as described above with reference to FIG. 11a) are then executed if the threshold voltage TH has drifted down or up, respectively, so as to restore the correct condition of the selected transistor. The method then descends into block 1164.

Considering now block 1164, a test is made to determine whether the last transistor of the word has been processed. If not, a next transistor is selected at block 1168, and the method returns to block 1162 to repeat the operations described above. Conversely, upon termination of the reading procedure the method ends at the final block 1160.

Similar considerations apply if equivalent methods are performed, if the programming and/or erasing pulses have a different value and/or length, if the refreshing procedure is carried out periodically (for example, after a pre-set number of programming/erasing procedures, such as ten), and the like. Alternatively, the two techniques described above are used in combination. In this case, the method verifies whether each transistor is in an error condition (using the error correction code); if so, the correct condition of the transistor is restored as shown in FIG. 11b. Conversely, the method verifies whether the threshold voltage of the transistor has entered a warning zone; if so, the correct condition of the transistor is restored as shown in FIG. 11a.

More generally, the present invention proposes a method of refreshing an electrically erasable and programmable non-volatile memory having a plurality of memory cells. The method starts with the step of verifying whether a memory cell has drifted from a correct condition; the correct condition of the memory cell is then individually restored if the result of the verification is positive.

In the solution of the invention the refreshing procedure is performed a memory cell at a time. Therefore, the data stored in the memory is refreshed in an absolutely safe manner (never changing the values stored in the other memory cells).

The proposed method strongly improves the data retention of the non-volatile memory.

Moreover, the method of the invention provides an active reliability mechanism for the memory.

These advantages are more apparent in modern flash memories having a very thin oxide layer, or in multilevel flash memories (even if different applications are not excluded and within the scope of the invention).

The preferred embodiment of the invention described above offers further advantages.

For example, one or more warning zones for the threshold voltage of each transistor are identified to define its correct condition. If the threshold voltage is comprised between the reference voltage and the corresponding low guard voltage the threshold voltage is assumed to have drifted up; conversely, if the threshold voltage is comprised between the reference voltage and the corresponding high guard voltage the threshold voltage is assumed to have drifted down.

These assumptions require that each transistor be refreshed frequently (with a period shorter than the time needed to have a drift equal to half the warning zone); however, the reliability of the flash memory is strongly improved (making possible to avoid the use of any error correction code).

Preferably, the threshold voltage is compared with the reference voltage, the corresponding low guard voltage and the corresponding high guard voltage simultaneously.

In this way, the time required to refresh the transistor is remarkably reduced.

As a further enhancement, one or more of the reference voltage, the corresponding low guard voltage and the corresponding high guard voltage are obtained from the other voltage(s).

The proposed feature makes it possible to reduce the number of reference cells (or equivalent circuits) used in the flash memory for implementing the method described above.

Alternatively, the correct condition of the transistor is defined in a different manner, the threshold voltage is compared with the reference voltage, the corresponding low guard voltage and the corresponding high guard voltage in sequence (using a single comparator), or a distinct reference cell/circuit is provided for any voltage required by the refreshing procedure.

In a different embodiment of the invention, the transistors to be refreshed are identified using an error correction code (in alternative to or in combination with the warning zones).

The proposed technique is able to detect when the value stored in a transistor has changed (even if the error occurred in the redundancy information); as a consequence, the refreshing procedure can be performed with a (relatively) low frequency.

As a further improvement, the transistor is refreshed during a reading procedure.

This feature avoids the need to have the refreshing procedure continually running in the background (even if the time required for reading a word is slightly increased).

Alternatively, the two techniques for identifying the transistors to be refreshed are used in a different way, the verification of the error correction code is performed periodically, or different techniques are envisaged for identifying the transistors to be refreshed.

In a preferred embodiment of the present invention, the correct condition of the transistor is restored using a series of one or more programming/erasing pulses.

In the devised solution, the threshold voltage of the transistor being refreshed is moved upwards or downwards so as to approach its correct condition; therefore, the refreshing procedure can be interrupted at any time without leaving the flash memory in an inconsistent configuration.

Advantageously, in a multilevel flash memory the threshold voltage is further compared with the low guard voltage or with the high guard voltage of an adjacent level.

This ensures that the transistor has not been over programmed or over erased during the refreshing procedure.

However, the solution according to the present invention leads itself to be implemented without verifying whether the threshold voltage has reached an adjacent level, restoring the correct condition of the transistor in a different manner (for example, applying a single programming/erasing pulse), or even without any check of the success of the refreshing.

Although a specific embodiment of the invention has been disclosed, it will be understood by those having skill in the art that changes can be made to this specific embodiment without departing from the spirit and scope of the invention. The scope of the invention is not to be restricted, therefore, to the specific embodiment, and it is intended that the appended claims cover any and all such applications, modifications, and embodiments within the scope of the present invention as defined by the following claims.

What is claimed is:

1. A method of refreshing an electrically erasable and programmable non-volatile memory comprising:

verifying, during a refresh process, whether a memory cell has drifted from a predetermined voltage; and individually restoring a corrected voltage of the memory cell if the memory cell has drifted from the predetermined voltage.

2. The method according to claim 1, wherein the verifying whether a memory cell has drifted from a predetermined voltage includes each of the memory cell stores one of a plurality of different logic values defined by an electric characteristic of the memory cell, and whereby each pair of adjacent logic values of the plurality of different logic values being delineated by a corresponding reference value.

3. The method according to claim 2, wherein the wherein the verifying whether a memory cell has drifted from a predetermined voltage includes verifying each reference value is associated with a first guard valise and a second guard value defining a warning zone around the reference value; and wherein the verifying whether the memory cell has drifted from a predetermined voltage includes determining that the electric characteristic has drifted in one of:

a first direction located between a current reference value and the corresponding first guard value; and a second direction located between the current reference value and the corresponding second guard value.

4. The method according to claim 3, wherein the verifying whether the memory cell has drifted from a predetermined voltage includes determining that the electric characteristic has drifted in one of the first direction and the second direction includes comparing the electric characteristic simultaneously with the current reference value, the corresponding first guard value and the corresponding second guard value.

5. The method according to claim 3, wherein the verifying whether the memory cell has drifted from a predetermined voltage includes determining that the electric characteristic has drifted in one of the first direction and the second direction further includes:

providing at least one value of a set consisting of the current reference value, the corresponding first guard value and the corresponding second guard value; and obtaining each other value of the net from the at least one provided value.

6. The method according to claim 4, wherein the verifying whether the memory cell has drifted from a predetermined voltage includes determining that the electric characteristic has drifted in one of the first direction and the second direction further includes:

providing at least one value of a set consisting of the current reference value, the corresponding first guard value and the corresponding second guard value; and obtaining each other value of the set from the at least one provided value.

7. The method according to claim 2, wherein the verifying whether the memory cell has drifted from a predetermined voltage includes:

reading a value stored in the memory cell;

correcting the value stored by means of a corresponding error correction code; and determining that the electric characteristic has drifted in one of a first direction and a second direction according to a comparison with the reference value associated with the corrected voltage.

8. The method according to claim 4, wherein the verifying whether the memory cell has drifted from a predetermined voltage includes:

reading a value stored in the memory cell;

correcting the value stored by means of a corresponding error correction code; and determining that the electric characteristic has drifted in one of the first direction and the second direction according to a comparison with the reference value associated with the corrected voltage.

9. The method according to claim 6, wherein the verifying whether the memory cell has drifted from a predetermined voltage includes:

reading a value stored in the memory cell;

correcting the value stored by means oh corresponding error correction code; and determining that the electric characteristic has drifted in one of the first direction and the second direction according to a comparison with the reference value associated with the corrected voltage.

10. The method according to claim 9, wherein the verifying whether the memory cell has drifted from a predetermined voltage includes verifying whether the memory cell has drifted from the predetermined voltage is performed during a reading procedure for outputting the corrected voltage.

11. The method according to claim from 3, wherein the individually restoring the corrected voltage includes:

applying a series of erasing pulses to the memory cell until the electric characteristic reaches the first guard value if the electric characteristic has drifted in the first direction; and applying a series of programming pulses to the memory cell until the electric characteristic reaches the second guard value if the electric characteristic has drifted in the second direction.

12. The method according to claim from 4, wherein the individually restoring the corrected voltage includes:

applying a series of erasing pulses to the memory cell until the electric characteristic reaches the first guard value if the electric characteristic has drifted in the first direction; and applying a series of programming pulses to the memory cell until the electric characteristic reaches the second guard value if the electric characteristic has drifted in the second direction.

13. The method according to claim from 6, wherein the individually restoring the corrected voltage includes:

applying a series of erasing pulses to the memory cell until the electric characteristic reaches the first guard value if the electric characteristic has drifted in the first direction; and applying a series of programming pulses to the memory cell until the electric characteristic reaches the second guard value if the electric characteristic has drifted in the second direction.

14. The method according to claim from 8, wherein the individually restoring the corrected voltage includes:

applying a series of erasing pulses to the memory cell until the electric characteristic reaches the first guard value if the electric characteristic has drifted in the first direction; and applying a series of programming pulses to the memory cell until the electric characteristic reaches the second guard value if the electric characteristic has drifted in the second direction.

15. The method according to claim from 9, wherein the individually restoring the corrected voltage includes:

applying a series of erasing pulses to the memory cell until the electric characteristic reaches the first guard value if the electric characteristic has drifted in the first direction; and applying a series of programming pulses to the memory cell until the electric characteristic reaches the second guard value if the electric characteristic has drifted in the second direction.

16. The method according to claim from 10, wherein the individually restoring the corrected voltage includes:

applying a series of erasing pulses to the memory cell until the electric characteristic reaches the first guard value if the electric characteristic has drifted in the first direction; and applying a series of programming pulses to the memory cell until the electric characteristic reaches the second guard value if the electric characteristic has drifted in the second direction.

17. The method according to claim 16, wherein the plurality of logic values consist of more than two logic values, and the individually restoring the corrected voltage further includes:

after applying the series of erasing pulses, then applying a series of further programming pulses to the memory cell if the electric characteristic has reached a next second guard value in the second direction; and after applying the series of programming pulses, then applying a series of further erasing pulses to the memory cell if the electric characteristic has reached a next first guard value in the first direction.

18. An electrically erasable and programmable non-volatile memory comprising:

a plurality of memory cells;

means for verifying, during a refresh process, whether a memory cell has drifted from a predetermined voltage; and means for individually restoring a corrected voltage of the memory cell if the memory cell has drifted from the predetermined voltage.

19. The memory of claim 18, Wherein the means for verifying is a current sense amplifier.

20. The memory of claim 18, wherein the means far individually restoring is a refreshing unit.

* * * * *

UNITED STATES PATENT AND TRADEMARK OFFICE
CERTIFICATE OF CORRECTION

PATENT NO. : 6,731,557 B2
DATED : May 4, 2004
INVENTOR(S) : Franco Enrico Beretta It is certified that error appears in the above-identified patent and that said Letters Patent is hereby corrected as shown below:

Column 12,
Line 54, change "includes each" to -- includes verifying each --.
Line 59, change "wherein the wherein" to -- wherein the --.
Line 62, change "valise" to -- value --.

Column 16,
Line 8, change "Wherein" to -- wherein --.
Line 10, change "far" to -- for --.

Signed and Sealed this

Sixteenth Day of August, 2005

JON W. DUDAS
*Director of the United States Patent and Trademark Office*